United States Patent [19]

Yao

[11] Patent Number: 5,422,572
[45] Date of Patent: Jun. 6, 1995

[54] METHOD AND APPARATUS FOR SUBSTANTIALLY SIMULTANEOUSLY EXCITING A PLURALITY OF SLICES IN NMR IMAGING

[75] Inventor: Ching Yao, San Mateo, Calif.

[73] Assignee: Toshiba America MRI, Inc., S. San Francisco, Calif.

[21] Appl. No.: 100,198

[22] Filed: Aug. 6, 1993

[51] Int. Cl.⁶ .............................................. G01R 33/48
[52] U.S. Cl. ..................................... 324/309; 324/314
[58] Field of Search ............... 324/300, 307, 309, 314; 128/653.2

[56] References Cited

U.S. PATENT DOCUMENTS

| | | | |
|---|---|---|---|
| 4,767,992 | 8/1988 | Ueyama | 324/309 |
| 4,803,432 | 2/1989 | Perman | 324/309 |
| 4,814,708 | 3/1989 | Van Der Meulen et al. | 324/309 |
| 4,820,984 | 4/1989 | Kuhn | 324/309 |
| 4,832,037 | 5/1989 | Granot | 324/309 |
| 4,843,322 | 6/1989 | Glover | 324/309 |
| 4,959,610 | 12/1990 | Suzuki | 324/309 |
| 5,233,301 | 8/1993 | Meyer et al. | 324/309 |
| 5,237,273 | 8/1993 | Plewes et al. | 324/309 |
| 5,289,862 | 3/1994 | Hennig | 324/309 |

FOREIGN PATENT DOCUMENTS

| | | |
|---|---|---|
| 112663 | 7/1984 | European Pat. Off. . |
| 229228 | 7/1987 | European Pat. Off. . |
| 0601229 | 6/1994 | European Pat. Off. . |
| 2936465 | 11/1981 | Germany . |

OTHER PUBLICATIONS

S. P. Souza et al., "SIMA: Simultaneous Multi-slice Acquistion of MR Images by Hadmard-encoded Excitiation", Journal of Computer Assisted Tomography, 12, 1026 (1988).

Magnetic Resonance in Medicine, vol. 13, No. 2 1 Feb. 1990, Duluth, Minn., pp. 279–292, H-P Hafner et al., "Numerical Analysis of Multislice MR Excitation and Inversion with Multifrequency Selective RF Pulses".

Magnetic Resonance in Medicine, vol. 19, No. 1, 1 May 1991, Duluth, Minn., pp. 105–112, G. J. Moore et al., "Simultaneous Multinuclear Magnetic Resonance Imaging and Spectroscopy".

Journal of Magnetic Resonance, vol. 102, No. 1, 1 Mar. 1993, Orlando, Minn., pp. 122–126, E. Kupce et al., "Polychromatic Selective Pulses".

Primary Examiner—Sandra L. O'Shea
Assistant Examiner—Raymond Y. Mah
Attorney, Agent, or Firm—Limbach & Limbach

[57] ABSTRACT

An NMR parallel imaging method and apparatus in a single sequence has a plurality of RF pulses applied substantially simultaneously, each having a different frequency, in the same contiguous time period in a sub-interval of time during which the select slice magnetic gradient is applied, to activate a plurality of different physical slices. The refocusing RF pulses also comprise a plurality of RF pulses each having a different frequency, applied non-simultaneously but within the same slice select magnetic gradient in the same subinterval of time. A plurality of echo signals from the plurality of different excited slices are then read out during the same single read out magnetic pulse in the same subinterval. The method and apparatus of the present invention can be applied in MRI spin echo, pre-saturation or inversion.

25 Claims, 5 Drawing Sheets

METHOD AND APPARATUS FOR SUBSTANTIALLY SIMULTANEOUSLY EXCITING A PLURALITY OF SLICES IN NMR IMAGING

TECHNICAL FIELD

The present invention relates to a method and an apparatus for parallel multi-slice NMR imaging, and more particularly to a method and an apparatus for exciting the plurality of slices substantially simultaneously.

BACKGROUND OF THE INVENTION

The formation of NMR images based upon excited nuclei is well known in the art. A typical sequence consists of a plurality of contiguous $T_R$ time periods. In the case of multi-slice/multi-echo sequence, each $T_R$ time period is further divided into a plurality of slice time intervals, or subinterval time periods.

In a serial exciting sequence, a single physical slice is excited and echo signals are acquired, in each subinterval time period. The echo signal is received by subjecting the patient or subject under study to a particular magnetic gradient pulse and applying a single RF signal having a particular frequency during the time period in which the magnetic gradient pulse is applied. The combination of the RF signal at the particular frequency and the application of the magnetic gradient pulse, serves to selectively excite a particular physical slice of selected nuclei. The readout of the RF signal occurs by the application of another magnetic gradient during which time the RF signal is received from the excited nuclei, as it decays, in the selected slice.

In an effort to expedite the acquisition of RF signals from a plurality of physical slices, U.S. Pat. No. 4,843,322 discloses a method for simultaneously exciting a plurality of slices in each single subinterval time periods to produce multi-slice NMR images. That reference discloses the application of two RF excitation pulses having different frequency during the subinterval time period in which a magnetic gradient is applied. (See column 10, lines 53–55). The application of RF signals simultaneously requires a considerable amount of power to the RF transmitter in the MRI apparatus. Therefore, as a practical matter, the teaching of the reference U.S. Pat. No. 4,843,322 has been limited to the application of two RF pulses simultaneously, thereby exciting only two physical slices simultaneously.

Once the plurality of RF echo signals from each subinterval time periods are received, U.S. Pat. No. 4,843,322 discloses the method of processing it in order derive the plurality of slice images from the plurality of physical slices. In addition, see "SIMA: Simultaneous Multi-slice Acquisition of MR Images by Hadmard-encoded Excitation" S. P. Souza et al, *Journal of Computer Assisted Tomography*, 12, 1026 (1988), referenced in U.S. Pat. No. 4,843,322 for disclosing the processing of the multi-signals acquired to produce multi-images.

SUMMARY OF THE INVENTION

In the present invention, a method and an apparatus for exciting a plurality of selected nuclei for NMR imaging is disclosed. The plurality of selected nuclei is subjected to a first magnetic gradient having a first gradient amplitude for a first contiguous period of time. The plurality of selected nuclei is then excited non-simultaneously during the first contiguous period of time by a plurality of first RF signals with each of the first RF signals having a frequency different from one another and having a first RF peak amplitude. The plurality of selected excited nuclei is then subjected to a second magnetic gradient having a second gradient amplitude for a second contiguous period of time. The plurality of selected nuclei is then excited non-simultaneously during the second contiguous period of time with a plurality of second RF signals. Each of the second RF signals has a frequency different from one another and has a second RF peak amplitude. A third magnetic gradient is applied during a third contiguous period of time. A plurality of RF signals is received from the plurality of selected excited nuclei during the third contiguous period of time.

DETAILED DESCRIPTION OF THE DRAWINGS

Figure 1:
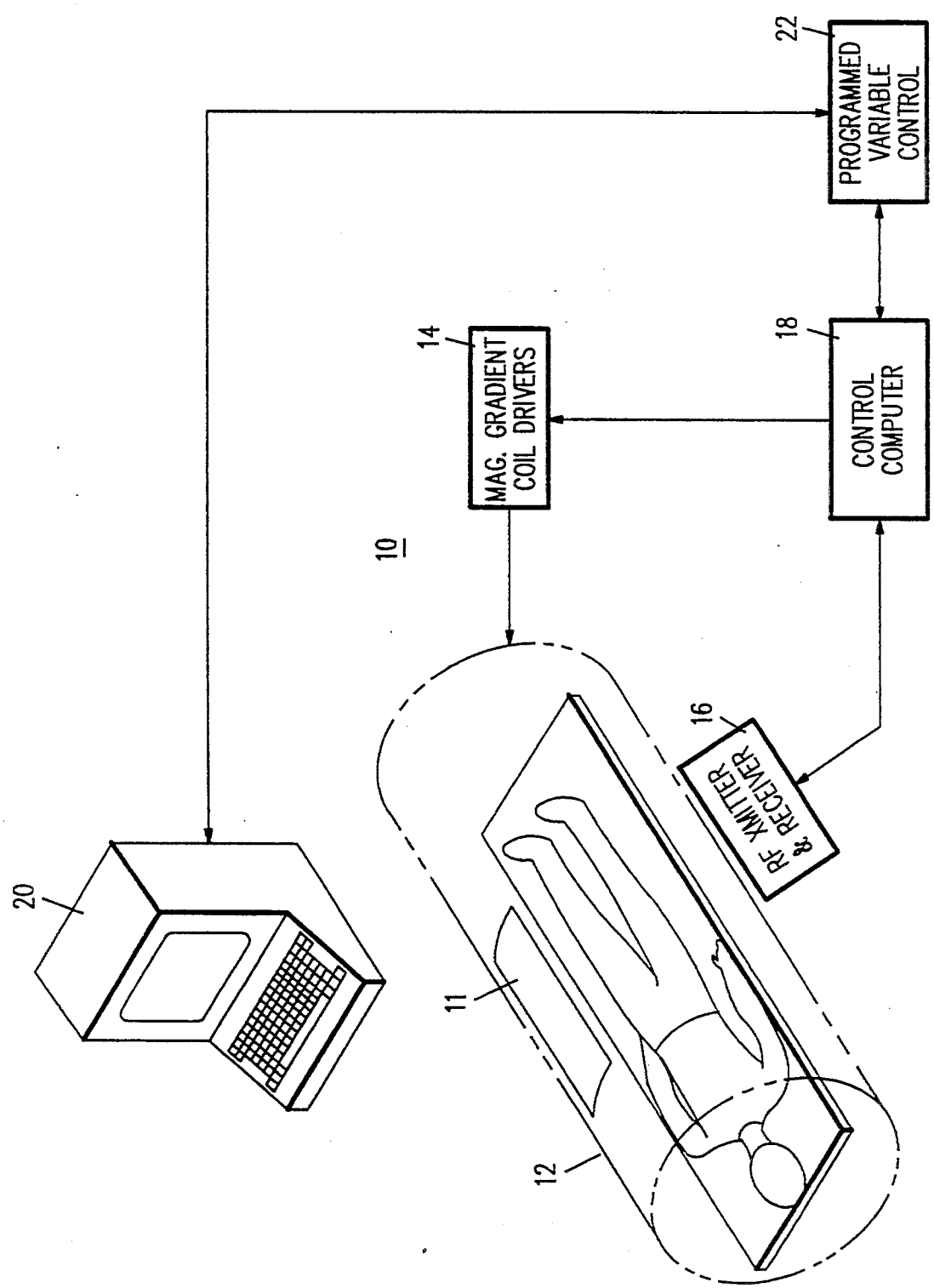
FIG. 1 is a schematic block diagram of an MRI instrument in accordance with the present invention.

Referring to FIG. 1 there is shown an MR instrument 10 suitable for use with the present invention. As is well known, the instrument 10 comprises a magnet 12, such as a superconductive magnet. The magnet 12 is typically cylindrically shaped, in which a patient is placed. The magnet 12 generates a static magnetic field, e.g. along the longitudinal axis of the patient.

The instrument 10 also comprises a plurality of magnetic gradient coils 11. The magnetic gradient coils 11 are driven by a plurality of magnetic gradient coil drivers 14, which supply the electric current to the magnetic gradient coils 11 to generate the necessary magnetic gradient fields. To select a particular "slice" or a group of selected nuclei, then to receive the MRI signal therefrom, the instrument 10 also comprises an RF transmitter and receiver 16. The RF transmitter and receiver 16 and the magnetic gradient coil drivers 14 are under the control of a control computer 18. The control computer 18 communicates with a host computer 22 which contains the programmed variable control. The operator interfaces with the keyboard/display terminal 20, which is connected to the host computer 22.

The timing of the energization of the gradient coils 11, and the RF transmitter and receiver 16 is controlled by a sequence, which is contained in the programmed variable control 22, which is used by the computer 18 to control the timing of the energization of the gradient coils 11, and of the RF transmitter and receiver 16.

The MR instrument 10 can perform the present invention which is in the nature of NMR parallel imaging in a single sequence. Each sequence typically comprises a plurality of $T_R$ intervals. Each $T_R$ is sometimes referred to as a "subsequence" of the overall sequence. Typically, a sequence comprises 256 $T_R$ or subsequences.

Figure 2:
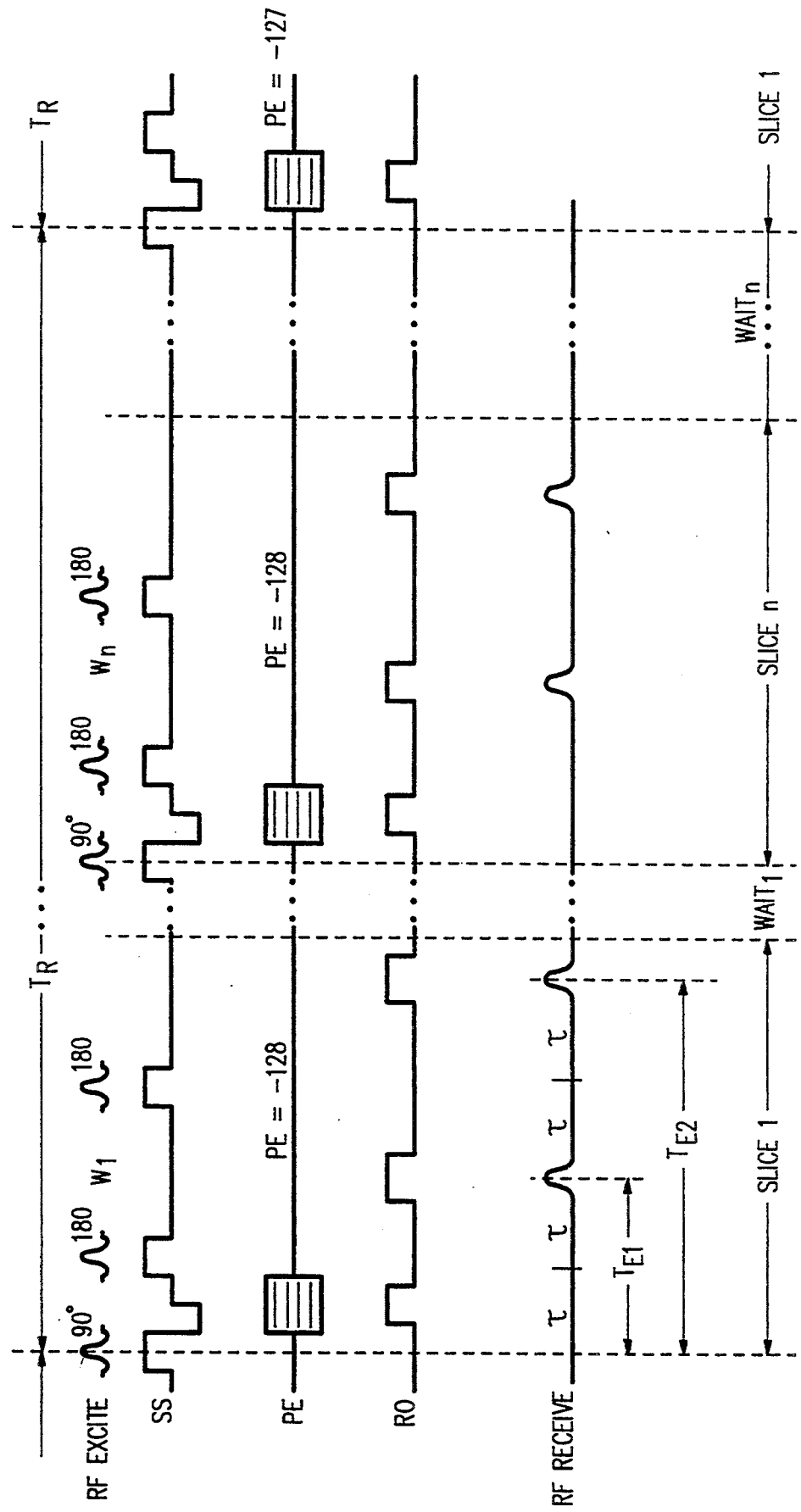
FIG. 2 is a schematic timing diagram of a portion of a MR serial imaging sequence of the prior art.

To better understand the present invention, reference is made to the serial imaging sequence of the prior art, as shown in FIG. 2. A $T_R$ subsequence comprises a plurality of N subintervals. At the beginning of each cycle of a subinterval, an RF nutation pulse of $\theta°$ (e.g., 90°) is applied in the presence of a slice select (SS) magnetic gradient pulse (e.g. $G_z$) so as to selectively address a given slice volume of hydrogen nuclei. In that slice subinterval, a phase encoding (or PE) magnetic gradient pulse (e.g. $G_y$) is imposed (e.g., having a magnitude/duration). In that same slice subinterval, a slice selective 180° RF refocusing pulse is applied to produce a first spin echo signal. The spin echo signal is received during the application of the read out (or RO) magnetic gradient (e.g. $G_x$). The first spin echo signal occurs at time $T_{E1}$ from the center of the RF nutation pulse (i.e. 90°).

An A/D converter (not shown) is activated prior to $T_{E1}$ and is turned off shortly after $T_{E1}$, from the center of the nutation pulse. Thus, the RF signal which is centered about $T_{E1}$ is sampled. The digital data is collected and stored in a file containing other first echo signals from that same slice, and with different PE gradient.

If a second spin echo signal is desired to be received, in that same cycle of the same slice, another 180° refocusing pulse is applied. A second read out gradient pulse is applied at or about the time $T_{E2}$ from the center of the nutation pulse. The A/D converter is activated prior to $T_{E2}$ and is turned off shortly after $T_{E2}$, from the center of the nutation pulse. Thus, the RF signal which is centered about $T_{E2}$ is sampled and is digitized. The digital data is collected and is stored in a file containing other second echo signals from that same slice.

After the collection of the second spin echo signal, if any, the time interval for the slice subinterval 1 includes a brief waiting period wait$_1$. During the entirety of the slice subinterval 1, the phase encoding gradient (PE) is set at a first value. As shown in FIG. 2 the phase encoding is set at $-128$.

During the second slice subinterval of the subsequence $T_R$, the frequency of the RF pulse is varied by a delta amount in order that a different physical slice of selected nuclei is excited and the signals therefrom are read out. The phase encoding gradient, however, is set the same as are the parameters $T_{E1}$ and $T_{E2}$. This continues for N slice subintervals. The sum of all slice subintervals; including the waiting period associated with each slice subinterval equals the desired time duration of $T_R$. Of course, within each subsequence $T_R$, the slice subintervals can proceed from one to another without a waiting period, with one waiting period at the end of the last slice subinterval N.

After the N slice subintervals, the sequence continues with the next subsequence $T_R$. In the next subsequence $T_R$, the above steps are repeated with the phase encoding gradient changed to a different value, e.g. $-127$.

After all the spin echo signals are collected, the stored spin echo signals for a particular slice, but with different phase encoding gradients thereto, are processed, by for example, using 2DFT or two dimensional fourier transform, to generate an image of the slice. Such processing is well known in the art.

The sequence shown hereinabove is termed a serial multislice/multiecho sequence wherein a plurality of slices with a plurality of echoes in each slice is read out. Thus, as can be seen from FIG. 2, in a single sequence of the prior art, N×M images (N=number of slices; M=number of echoes in each slice) with each image representing a slice of different selected nuclei and a $T_E$ value can be produced. As can be seen, during each subinterval time period, only one slice is physically excited because the frequency of the RF pulse is set at a constant during that subinterval time period.

Figure 3:
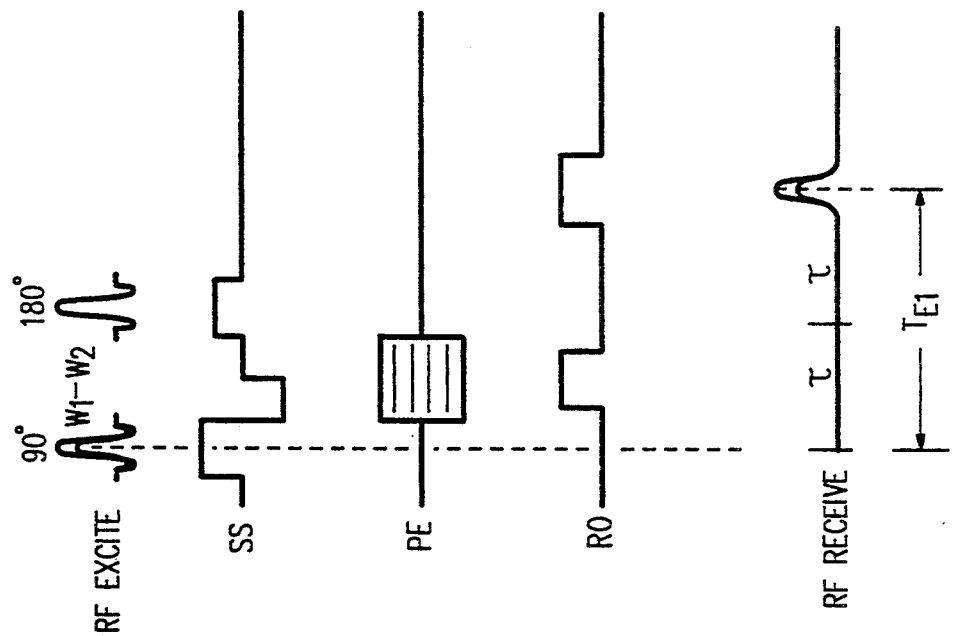
FIG. 3 is a schematic timing diagram of a portion of a MR parallel imaging sequence of the prior art.

Referring to FIG. 3 there is shown a portion of another imaging sequence of the prior art. The imaging sequence shown in FIG. 3 is a parallel imaging sequence and is that which is disclosed in U.S. Pat. No. 4,843,322.

As disclosed in U.S. Pat. No. 4,843,322, at the beginning of each subinterval cycle, a slice select magnetic gradient pulse (e.g. $G_z$) is activated for a contiguous time period, during which two 90° RF nutation pulses having different frequencies are applied simultaneously. The two 90° RF nutation pulses excite two physically different slices. Each RF nutation pulse is of the general shape sin(x)/x. Similar to the serial sequence shown and described in FIG. 2, a phase encoding (or PE) magnetic gradient pulse (e.g. $G_y$) is imposed (e.g., having a magnitude/duration). Then, in that same subinterval time period, a second slice select magnetic gradient pulse is applied for a contiguous time period, during which a single 180° RF refocusing pulse is applied. The gradient amplitude of the second slice select magnetic gradient pulse is reduced so as to cause the single 180° RF refocusing pulse to refocus the two excited slices.

The spin echo signals, resultant therefrom, are received during the application of the read out (or RO) magnetic gradient (e.g. $G_x$). The two spin echo signals occur at a time $T_{E1}$ from the center of the RF nutation pulses (i.e. 90°). Further, as disclosed in U.S. Pat. No. 4,843,322, after all of the spin echo signals from all the slices are collected, they can be processed to form an image array and subsequently to form an image of each of the slices.

As previously discussed, the disadvantage of this method is that since the RF pulses are applied simultaneously, there is a considerable amount of power requirement to the RF transmitter. Therefore, as a practical matter, this method has been limited to the application of only two RF pulses of different frequencies simultaneously.

Figure 4:
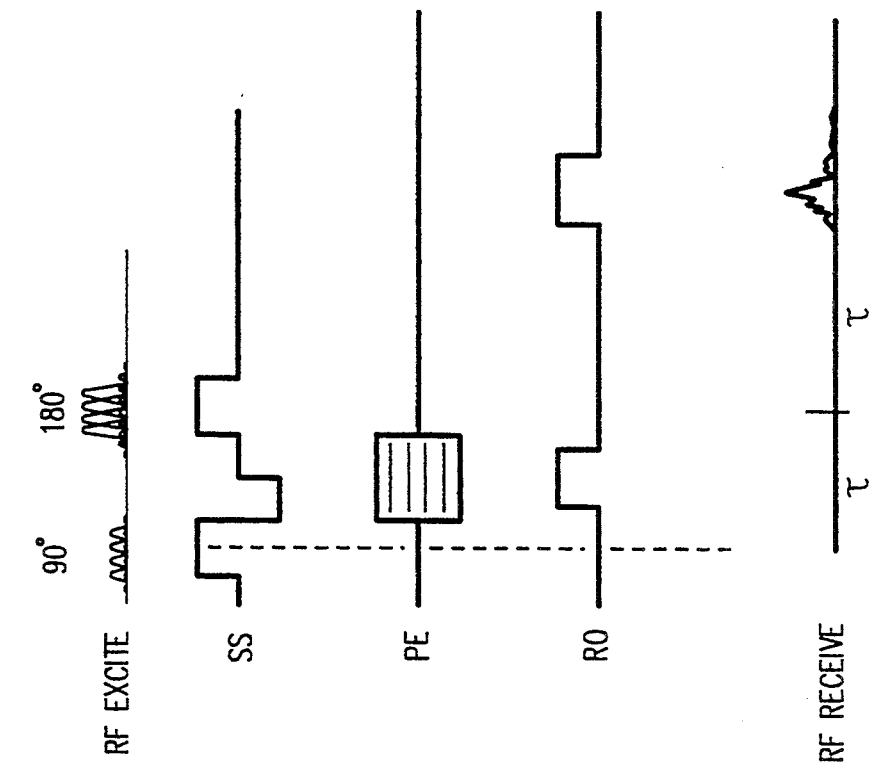
FIG. 4 is a schematic timing diagram of the method of MR parallel imaging sequence of the present invention.
Figure 5:
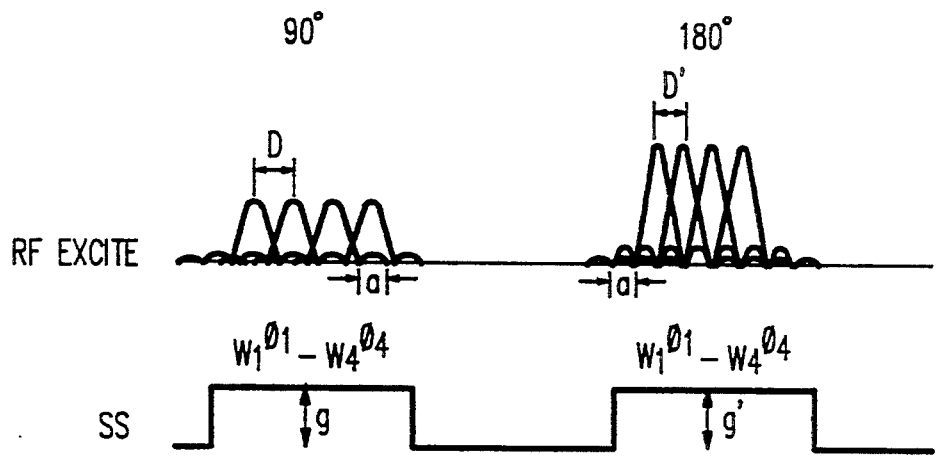
FIG. 5 is an enlarged detailed schematic timing diagram of a portion of the timing diagram shown in FIG. 4, showing the relationship between the envelope of the wave forms and the amplitude of the applied magnetic gradient.
Figure 8:
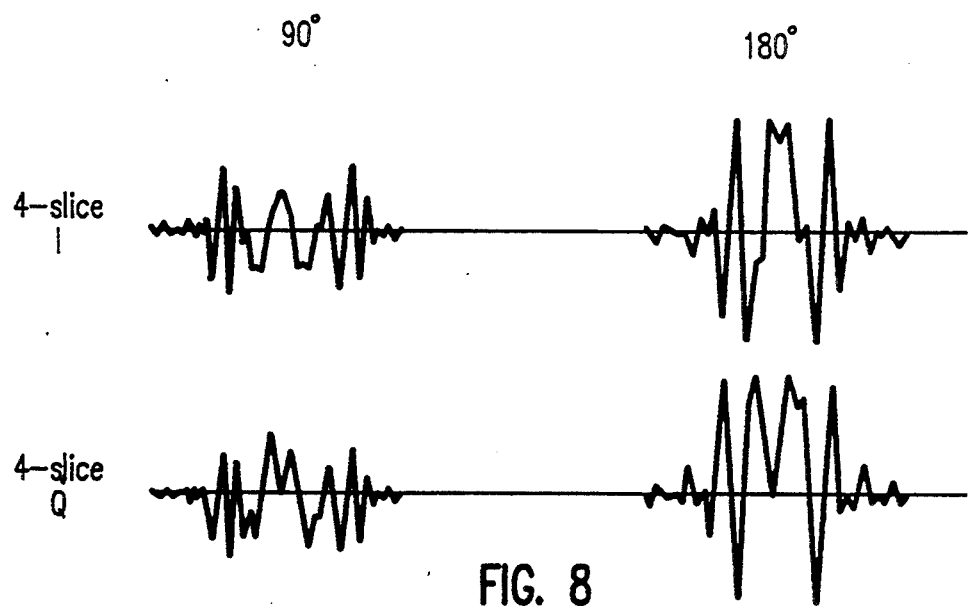
FIG. 8 are timing diagrams of four RF pulses used in the sequence shown in FIG. 5, with the interferences of the RF pulses shown.

Referring to FIG. 4 there is shown a timing diagram of a near-simultaneous excitation, parallel imaging sequence of the present invention. In the sequence shown in FIG. 4 which is a portion of one subinterval time period, a slice select (SS) magnetic gradient pulse (e.g. $G_z$) is applied during the commencement of the subinterval cycle. During the time period in which the slice select magnetic gradient pulse is applied, a plurality of 90° RF nutation pulses are applied so as to selectively excite a plurality of different slice volumes of hydrogen nuclei. Each of the plurality of 90° RF nutation pulses has a different frequency so as to selectively excite nuclei from a different physical slice of volume. In addition, each of the 90° RF nutation pulses is substantially of the wave form sin(x)/x so as to produce a peak amplitude. The peak amplitude of the envelope of the wave forms for the plurality of 90° RF pulses are spaced apart in time from one another. (The actual RF wave form as a result of the constructive and destructive interferences, is shown in FIG. 8.) As can be seen in FIG. 5, the peak amplitude of each of the 90° RF nutation pulses is separated in time by the amount D. The amplitude of the slice select magnetic gradient pulse is substantially constant and is of the amount g. In practice, the plurality of 90° RF nutation pulses are stored in the control computer 18, and is applied as one wave form when needed. The total number of distinct 90° pulses is equal to the desired number of slices that are to be excited. Only one 180° composite pulse is needed. A different 90° composite pulse is applied each time. The set of 90° composite pulse is repeatedly cycled through, in step with the progression of phase encoding.

The plurality of 90° RF nutation pulses are "squeezed" together in time, as much as possible to reduce the temporal separation, D, between adjacent peak amplitudes of the envelope of the RF pulse waveform. To accomplish that, the phase of each 90° RF nutation pulse is adjusted to reduce the constructive interference.

Thereafter, similar to the prior art, a phase encoding (or PE) magnetic gradient pulse (e.g. $G_y$) is imposed. Finally, a second slice selective (SS) magnetic gradient pulse (e.g. $G_z$) is applied during a second contiguous period of time. During this second contiguous period time, a plurality of slice selective 180° RF refocusing pulses, each having a different frequency, are applied to produce a plurality of spin echo signals. similar to the 90° RF nutation pulses applied in the beginning of each of the subinterval time period, each of the 180° RF refocusing pulses is generally of the shape sin(x)/x. Each of the 180° RF refocusing pulse has a peak amplitude which is separated apart from one another in time. As show in FIG. 5, in one embodiment this amount of separation in time is denoted as D'. Further, the second slice select magnetic gradient pulse has a substantially constant amplitude denoted as g'. The frequencies of the plurality of 180° RF refocusing pulses are matched to the frequencies of the plurality of 90° RF nutation pulses in the ratio of the corresponding gradients. Again, in practice, the plurality of 180° RF refocusing pulses are stored in the control computer 18, and is applied as one wave form when needed.

Similar to the plurality of 90° RF nutation pulses, the plurality of 180° RF refocusing pulses are "squeezed" together in time, as much as possible to reduce the temporal separation, D', between adjacent peak amplitudes of the envelope of the RF pulse waveform. To accomplish that, the phase of each 180° RF refocusing pulse is adjusted to reduce the constructive interference.

The plurality of spin echo signals, one from each of the excited physical slices, is received during the application of the read out (or RO) magnetic gradient (e.g. $G_x$). The RO magnetic gradient pulse is applied during a third contiguous period of time, after the second slice select magnetic gradient pulse is applied. Similar to the prior art, each of the echo signals from each of the excited slice is "read out" or is received at time $T_{E1}$ from the center of the 90° RF nutation pulse, which excited that slice.

The parameters D,D',g,g', are all shown in FIG. 5. As previously discussed, the 90° RF nutation pulse and the 180° RF refocusing pulse is of the form sin(x)/x and has a peak amplitude and a lobe which is substantially negative, as shown in FIG. 5. This is well known in the art. The duration of the lobe is designated "a". It has been found in the preferred embodiment, that the aforementioned parameters must satisfy the following relationships.

D ≈ a to 2a
gD = 2g'D'
If g' = 0.8g, then gD = 2g'D' becomes D = 1.6D'
By setting the value of D', D is then known.

As can be seen from the foregoing, because the 90° RF nutation pulses and the 180° RF refocusing pulses are not applied simultaneously, they do not strain the current requirements of the RF transmitter of the MRI instrument. Furthermore, because they are applied during the same subinterval time period, the method and the apparatus of the present invention achieves the same benefit as that which is shown and described in U.S. Pat. No. 4,843,322. As shown in FIG. 5, four RF pulses, each having a different frequency (both 90° RF nutation as well as 180° RF refocusing pulses) can be applied during the same subinterval time period. In the preferred embodiment, it has been found that up to six RF (both 90° nutation and 180° refocusing) pulses, each with different frequencies, can be applied during the same slice select magnetic gradient in the same subinterval, to achieve the same effect as if the six RF pulses were applied simultaneously.

Figure 6:
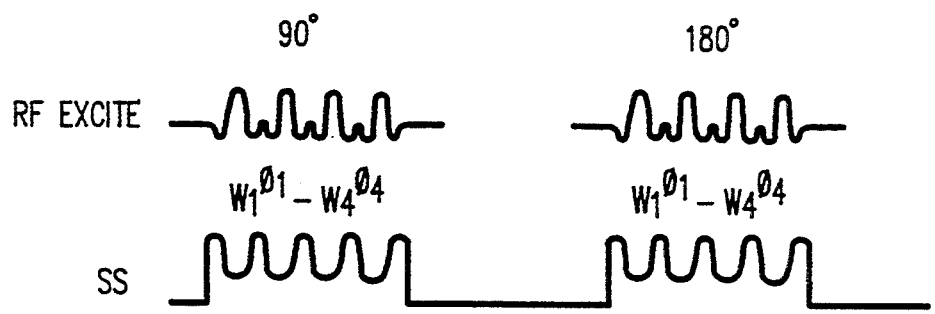
FIG. 6 is a timing diagram of another embodiment of the method and apparatus of the present invention shown in FIG. 5, wherein peak amplitude of the envelope of the RF pulse is reduced by varying the amplitude of the magnetic gradient.

Referring to FIG. 6 there is shown a timing diagram of another embodiment of a sequence shown in FIG. 5 showing an extension of the method and apparatus of the present invention. The sequence shown in FIG. 6 shows the amplitude of the magnetic gradients being varied, during the time period in which the 90° nutation and 180° refocusing pulses are applied. The variation of the amplitude of the magnetic gradients, reduces the peak amplitude requirement of the RF pulses. Thus, with this refinement, further reduction in peak power requirements is possible.

Figure 7:
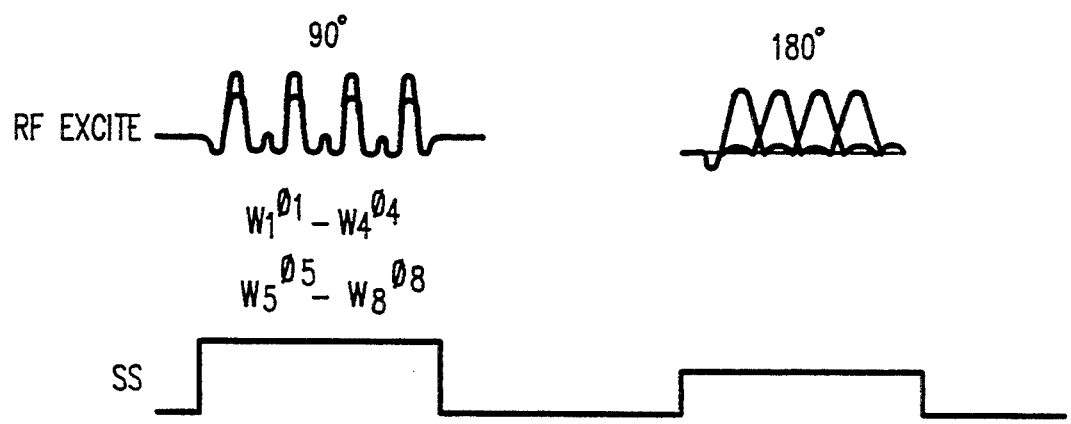
FIG. 7 is a timing diagram of yet another embodiment of the method and apparatus of the present invention shown in FIG. 5.

Referring to FIG. 7, there is shown a sequence which is an improvement to the method and apparatus of the present invention shown in FIG. 5, to double the number of slices, which can be excited "nearly simultaneously" in a single subinterval of time. As previously discussed, one of the problems of the prior art as disclosed in U.S. Pat. No. 4,843,322 is that the application of RF pulses simultaneously requires excessive power peak drain on the RF transmitter. In the embodiment shown in FIG. 7, two 90° RF nutation pulses, each having a different frequency are applied simultaneously. However, each of the RF pulses has a different commencement phase. As a result, there would be times of destructive and constructive interference resulting in dynamic interference. This would reduce the total peak amplitude requirement of the RF transmitter to less then two times the peak amplitude of a single RF pulse. However, it has been found that this reduction is modest (on the order of 10–20%, or less). This is shown in FIG. 7 with the wave form of the accompanying slice selective magnetic gradient.

As can be seen, the wave form of the slice select magnetic gradient is substantially a constant amplitude, the same as shown and described in FIG. 5. Using this method and apparatus, a plurality of first 90° RF nutation pulses, each having a different frequency are applied. A second plurality of 90° RF nutation pulses, each having a frequency different from one another and different from the first plurality are also applied. An RF pulse of the second plurality is applied coincident in time with an RF pulse from the first plurality. In addition, the commencement phase of the RF pulses from the second plurality are different from the phase of the first plurality of RF pulses. As a result, the number of RF pulses having different frequencies which can be applied during any particular subinterval time period can be doubled.

During the time period in which the second slice selective magnetic gradient is applied, a single plurality of 180° RF refocusing pulses are applied. the number of 180° RF refocusing pulses is equal to ½ the total number of 90° RF nutation pulses applied during the first period of time.

Similar to the prior art disclosed in U.S. Pat. No. 4,843,322, the amplitude of the magnetic gradient applied during this second period of time is reduced so that each 180° RF refocusing pulse physically refocuses the two slices of volume excited by the two 90° RF nutation pulses.

Once the plurality of echo signals are received they can be further processed to form an image array or a plurality of slice images, which are well known in the art. The method and apparatus of the present invention can be used in MRI spin echo, pre-saturation or inversion.

There are many advantages to the method and apparatus of the present invention. First and foremost is that the invention achieves the advantages of parallel imaging sequence without the drawbacks of the limitation on the peak power requirement for the RF transmitter as depicted in the prior art. In addition, with the additional refinements, the present invention permits echo signals to be acquired from a greater number of different slices, in the same subinterval of time, than the prior art.

What is claimed is:

1. In an NMR system for producing images from an NMR data set acquired from a set of NMR pulse sequences, the improved method comprising:
    applying a plurality of non-simultaneous RF excitation pulses during the same time period that an associated magnetic gradient is activated, said plurality of RF excited pulses forming at least one composite pulse envelope of nearly merged RF pulses, said plurality of RF excitation pulses exciting spins in a plurality of different slices, with portions of said RF pulses partially overlapping one another;
    receiving a plurality of NMR data set from the spins excited during the same time period the associated magnetic gradient is activated; and
    performing a transformation of the received NMR data set, to produce an image array.

2. The method of claim 1 further comprising the step of
    separating the slice images contained in the image array for each of said plurality of slices.

3. A method of exciting a plurality of selected nuclei for NMR imaging comprising the steps of:
    subjecting the plurality of selected nuclei to a first magnetic gradient having a first gradient amplitude for a first contiguous period of time;
    exciting the plurality of selected nuclei, during said first contiguous period of time, with a plurality of first RF signals, said plurality of first RF signals forming at least one composite pulse envelope of nearly merged RF pulses, each of said first RF signals having a frequency different from one another and having a first RF peak amplitude, spaced apart in time from one another, with portions of said first RF signals partially overlapping one another;
    subjecting the plurality of selected nuclei to a second magnetic gradient having a second gradient amplitude for a second contiguous period of time;
    exciting said plurality of selected nuclei, during said second contiguous period of time, with a plurality of second RF signals, said plurality of second RF signals forming at least one composite pulse envelope of nearly merged RF pulses, each of said second RF signals having a frequency different from one another and having a second RF peak amplitude, spaced apart in time from one another, with portions of said second RF signals partially overlapping one another;
    applying a third magnetic gradient during a third contiguous period of time; and
    receiving a plurality of RF signals from said plurality of selected nuclei during said third contiguous period of time.

4. The method of claim 3 wherein said first RF peak amplitudes are separated by D, said second RF peak amplitudes are separated by D', said first gradient amplitude is g and said second gradient amplitude is g' and wherein
$$gD = 2g'D'.$$

5. The method of claim 3 wherein said first RF signals are 90° RF pulses and said second RF signals are 180° RF pulses.

6. The method of claim 3 further comprising the steps of:
    unscrambling said plurality of RF signals received to form a plurality of unscrambled signals.

7. The method of claim 3 wherein said plurality of first RF signals comprises a first plurality and a second plurality of first RF signals, with each of said first plurality of first RF signals having a first RF peak amplitude spaced apart in time from one another and each of said second plurality of first RF signals having a first RF peak amplitude, spaced apart in time from on another, and coincident in time with a first RF peak amplitude of one of the first plurality of first RF signals.

8. The method of claim 7 wherein said first magnetic gradient has a first gradient amplitude substantially constant over said first period of time.

9. The method of claim 7 wherein said plurality of second RF signals comprises a number of RF signals equal to the first plurality of first RF signals.

10. The method of claim 9 wherein said second gradient amplitude is less than said first gradient amplitude.

11. The method of claim 3 wherein said first magnetic gradient has a first gradient amplitude varying over said first period of time.

12. The method of claim 11 wherein said second magnetic gradient has a second gradient amplitude varying over said second period of time.

13. An apparatus for exciting a plurality of selected nuclei for NMR imaging, said apparatus comprising:
    means for applying a first magnetic gradient having a first gradient amplitude to the plurality of selected nuclei for a first period of time;
    means for exciting the plurality of selected nuclei during said first period of time, with a plurality of first RF signals, said plurality of first RF signals forming at least one composite pulse envelope of nearly merged RF pulses, each of said first RF signals having a frequency different from one another and having a first RF peak amplitude, spaced apart in time from one another, with portions of said first RF signals partially overlapping one another;

means for applying a second magnetic gradient having a second gradient amplitude to the plurality of selected nuclei for a second period of time;

means for exciting the plurality of selected nuclei during said second period of time, with a plurality of second RF signals, said plurality of second RF signals forming at least one composite pulse envelope of nearly merged RF pulses, each of said second RF signals having a frequency different from one another and having a second RF peak amplitude, spaced apart in time from one another, with portions of said second RF signals partially overlapping one another;

means for applying a third magnetic gradient during a third period of time; and means for receiving a plurality of RF signals from said plurality of selected nuclei during said third period of time.

14. The apparatus of claim 13 wherein said first RF peak amplitudes are separated by D, said second RF peak amplitudes are separated by D', said first gradient amplitude is g and said second gradient amplitude is g' and wherein $$gD = 2g'D'.$$

15. The apparatus of claim 13 wherein said first RF signals are 90° RF pulses and said second RF signals are 180° RF pulses.

16. The apparatus of claim 13 further comprising:
means for unscrambling said plurality of RF signals received to from a plurality of unscrambled signals.

17. The apparatus of claim 13 wherein said plurality of first RF signals comprises a first plurality and a second plurality of first RF signals, with each of said first plurality of first RF signals having a first RF peak amplitude spaced apart in time from one another and each of said second plurality of first RF signals having a first RF peak amplitude, spaced apart in time from on another, and coincident in time with a first RF peak amplitude of one of the first plurality of first RF signals.

18. The apparatus of claim 17 wherein said first magnetic gradient has a first gradient amplitude substantially constant over said first period of time.

19. The apparatus of claim 17 wherein said plurality of second RF signals comprises a number of RF signals equal to the first plurality of first RF signals.

20. The apparatus of claim 19 wherein said gradient amplitude is second less than said first gradient amplitude.

21. The apparatus of claim 13 wherein said first magnetic gradient has a first gradient amplitude varying over said first period of time.

22. The apparatus of claim 21 wherein said second magnetic gradient has a second gradient amplitude varying over said second period of time.

23. A method of producing a plurality of images from a plurality of slices in an NMR imaging said method comprising:

applying a first magnetic gradient having a first gradient amplitude for a first contiguous period of time to the plurality of slices;

exciting the plurality of slices, during said first contiguous period of time, with a plurality of first RF signals, non-simultaneously, said plurality of first RF signals forming at least one composite pulse envelope of nearly merged RF pulses, with portions of said first RF signals partially overlapping one another;

applying a second magnetic gradient having a second gradient amplitude for a second contiguous period of time to the plurality of slices;

exciting the plurality of slices, during said second contiguous period of time, with a plurality of second RF signals, non-simultaneously, said plurality of second RF signals forming at least one composite pulse envelope of nearly merged RF pulses, with portions of said second RF signals partially overlapping one another;

applying a third magnetic gradient for a third contiguous period of time to the plurality of slices;

receiving a plurality of RF signals from the plurality of slices during the third contiguous period of time; and processing said plurality of signals received to form the plurality of images from the plurality of slices.

24. The method of claim 3 further comprising the steps of:
manipulating the phase of said first RF pulses; and
manipulating the phase of said second RF pulses.

25. The apparatus of claim 13 further comprising:
means for manipulating the phase of said first RF pulses; and
means for manipulating the phase of said second RF pulses.

* * * * *